(12) United States Patent
Kato et al.

(10) Patent No.: US 12,740,089 B2
(45) Date of Patent: Sep. 15, 2026

(54) SEMICONDUCTOR DEVICE AND METHOD FOR MANUFACTURING THE SAME

(71) Applicant: KABUSHIKI KAISHA TOSHIBA, Tokyo (JP)

(72) Inventors: Daimotsu Kato, Kawasaki Kanagawa (JP); Yosuke Kajiwara, Yokohama Kanagawa (JP); Hiroshi Ono, Tokyo (JP); Aya Shindome, Yokohama Kanagawa (JP); Ikuo Fujiwara, Yokohama Kanagawa (JP); Masahiko Kuraguchi, Yokohama Kanagawa (JP); Tatsuo Shimizu, Tokyo (JP)

(73) Assignee: KABUSHIKI KAISHA TOSHIBA, Kawasaki (JP)

( * ) Notice: Subject to any disclaimer, the term of this patent is extended or adjusted under 35 U.S.C. 154(b) by 507 days.

(21) Appl. No.: 18/361,647

(22) Filed: Jul. 28, 2023

(65) Prior Publication Data

US 2024/0313100 A1 Sep. 19, 2024

(30) Foreign Application Priority Data

Mar. 13, 2023 (JP) ................................. 2023-038325

(51) Int. Cl.
*H10D 30/47* (2025.01)
*H10D 62/60* (2025.01)
(Continued)

(52) U.S. Cl.
CPC ........... *H10D 30/475* (2025.01); *H10D 62/60* (2025.01); *H10D 62/8503* (2025.01); *H10D 64/513* (2025.01)

(58) Field of Classification Search
CPC ... H10D 30/475; H10D 62/60; H10D 62/8503
See application file for complete search history.

(56) References Cited

U.S. PATENT DOCUMENTS 8,030,660 B2 10/2011 Saito et al.
9,082,834 B2 7/2015 Yasui et al.
(Continued)

FOREIGN PATENT DOCUMENTS

JP 2009-218566 A 9/2009
JP 2013-179359 A 9/2013
(Continued)

*Primary Examiner* — Joseph C. Nicely
(74) *Attorney, Agent, or Firm* — Finnegan, Henderson, Farabow, Garrett & Dunner, LLP

(57) ABSTRACT

According to one embodiment, a semiconductor device includes a first electrode, a second electrode, a third electrode, a first semiconductor region, a second semiconductor region, a first nitride region, and a first insulating member. The first semiconductor region includes $Al_{x1}Ga_{1-x1}N$ $(0 \leq x1 < 1)$. The second semiconductor region including $Al_{x2}Ga_{1-x2}N$ $(0 < x2 < 1, x1 < x2)$. The first nitride region includes $Al_{z1}Ga_{1-z1}N$ $(0 < z1 \leq 1, x2 < z1)$. The first nitride region includes a first nitride portion. The first nitride portion includes a first position. The first position is a center of the first nitride portion. The third partial region of the first semiconductor region includes a first face facing the first nitride portion. A chlorine concentration at the first position is lower than a chlorine concentration at the first face.

17 Claims, 6 Drawing Sheets

(51) Int. Cl.
*H10D 62/85* (2025.01)
*H10D 64/27* (2025.01)

(56) References Cited

U.S. PATENT DOCUMENTS

| | | | | |
|---|---|---|---|---|
| 9,837,521 | B2 | 12/2017 | Yamamoto et al. | |
| 2009/0200576 | A1 | 8/2009 | Saito et al. | |
| 2011/0309413 | A1 | 12/2011 | Saito et al. | |
| 2015/0076562 | A1 | 3/2015 | Yasui et al. | |
| 2017/0077277 | A1* | 3/2017 | Saito | H10D 30/475 |
| 2018/0219088 | A1 | 8/2018 | Uesugi et al. | |
| 2019/0280112 | A1 | 9/2019 | Shimizu et al. | |
| 2020/0144386 | A1 | 5/2020 | Kanda et al. | |
| 2020/0295169 | A1* | 9/2020 | Kato | H10D 62/824 |
| 2021/0217853 | A1 | 7/2021 | Hirasaki et al. | |

FOREIGN PATENT DOCUMENTS

| | | | |
|---|---|---|---|
| JP | 2013-219273 | A | 10/2013 |
| JP | 2013-258259 | A | 12/2013 |
| JP | 2014-57092 | A | 3/2014 |
| JP | 2014-197644 | A | 10/2014 |
| JP | 5917990 | B2 | 5/2016 |
| JP | 2018-125440 | A | 8/2018 |
| JP | 6629252 | B2 | 1/2020 |
| JP | 6767411 | B2 | 10/2020 |
| JP | 2021-111698 | A | 8/2021 |
| JP | 7002015 | B2 | 1/2022 |
| WO | WO 2013/0153927 | A1 | 10/2013 |
| WO | WO 2014/057906 | A1 | 4/2014 |

* cited by examiner

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2023-038325, filed on Mar. 13, 2023; the entire contents of which are incorporated herein by reference.

FIELD

Embodiments of the invention generally relate to a semiconductor device and a method for manufacturing the same.

BACKGROUND

For example, semiconductor devices are desired to have improved characteristics.

DETAILED DESCRIPTION

Figure 1:
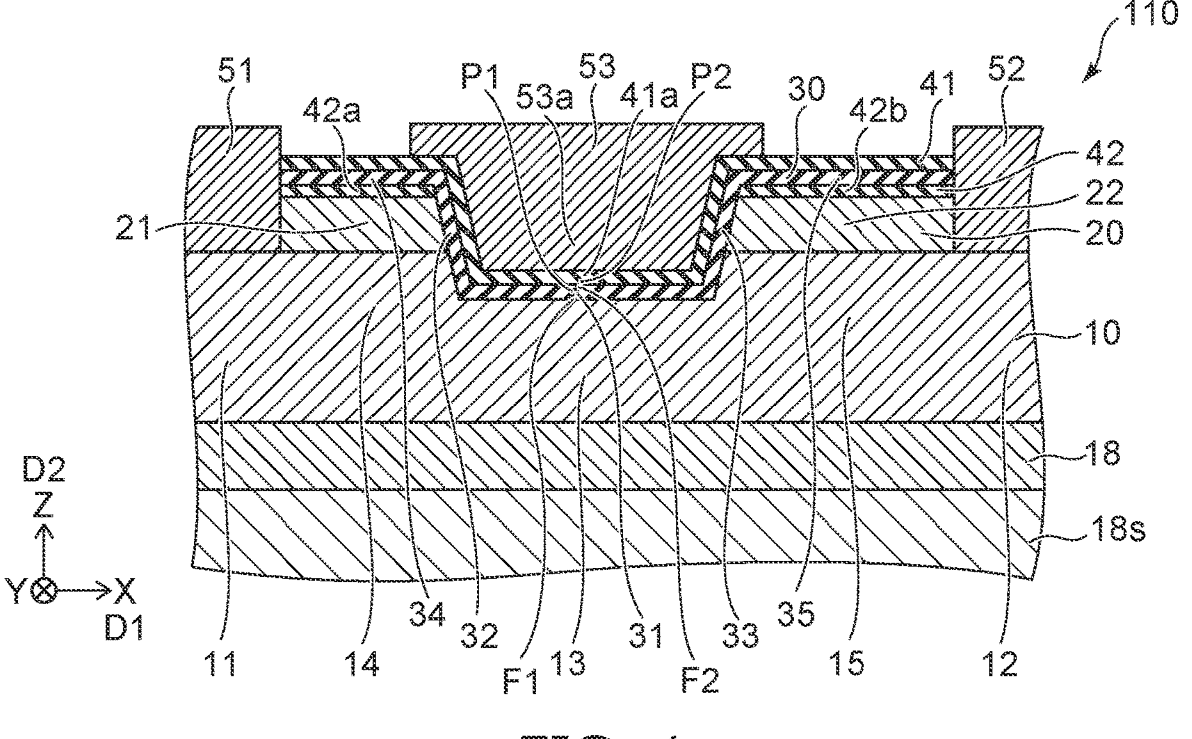
FIG. 1 is a schematic cross-sectional view illustrating a semiconductor device according to a first embodiment.

According to one embodiment, a semiconductor device includes a first electrode, a second electrode, a third electrode, a first semiconductor region, a second semiconductor region, a first nitride region, and a first insulating member. A direction from the first electrode to the second electrode is along a first direction. The third electrode includes a first electrode portion. A position of the third electrode in the first direction is between a position of the first electrode in the first direction and a position of the second electrode in the first direction. The first semiconductor region includes $Al_{x1}Ga_{1-x1}N$ ($0 \leq x1 < 1$). The first semiconductor region includes a first partial region, a second partial region, a third partial region, a fourth partial region, and a fifth partial region. A second direction from the first partial region to the first electrode crosses the first direction. A direction from the second partial region to the second electrode is along the second direction. A direction from the third partial region to the first electrode is along the second direction. A position of the fourth partial region in the first direction is between a position of the first partial region in the first direction and a position of the third partial region in the first direction. A position of the fifth partial region in the first direction is between the position of the third partial region in the first direction and a position of the second partial region in the first direction. The second semiconductor region including $Al_{x2}Ga_{1-x2}N$ ($0 < x2 < 1$, $x1 < x2$). The second semiconductor region includes a first semiconductor portion and a second semiconductor portion. A direction from the fourth partial region to the first semiconductor portion is along the second direction. A direction from the fifth partial region to the second semiconductor portion is along the second direction. The first nitride region includes $Al_{z1}Ga_{1-z1}N$ ($0 < z1 \leq 1$, $x2 < z1$). The first nitride region includes a first nitride portion. The first nitride portion is located between the third partial region and the first electrode portion. The first insulating member includes a first insulating portion. The first insulating portion is located between the first nitride portion and the first electrode portion. The first nitride portion includes a first position. The first position is a center of the first nitride portion in the second direction. The third partial region includes a first face facing the first nitride portion. A chlorine concentration at the first position is lower than a chlorine concentration at the first face.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, a semiconductor device 110 according to the embodiment includes a first electrode 51, a second electrode 52, a third electrode 53, a first semiconductor region 10, a second semiconductor region 20, a first nitride region 30 and a first insulating member 41.

A direction from the first electrode 51 to the second electrode 52 is along a first direction D1. The first direction D1 is defined as an X-axis direction. One direction perpendicular to the X-axis direction is defined as a Z-axis direction. A direction perpendicular to the X-axis direction and the Z-axis direction is defined as a Y-axis direction.

The third electrode 53 includes a first electrode portion 53*a*. A position of the third electrode 53 in the first direction D1 is between a position of the first electrode 51 in the first direction D1 and a position of the second electrode 52 in the first direction D1.

The first semiconductor region 10 includes $Al_{x1}Ga_{1-x1}N$ ($0 \leq x1 < 1$). The composition ratio x1 may be, for example, not less than 0 and not more than 0.1. The first semiconductor region 10 is, for example, a GaN layer. The first semiconductor region 10 includes a first partial region 11, a second partial region 12, a third partial region 13, a fourth partial region 14 and a fifth partial region 15. A second direction D2 from the first partial region 11 to the first electrode 51 crosses the first direction D1. The second direction D2 is, for example, the Z-axis direction.

A direction from the second partial region 12 to the second electrode 52 is along the second direction D2. A direction from the third partial region 13 to the first electrode portion 53*a* is along the second direction D2. A position of the fourth partial region 14 in the first direction D1 is between a position of the first partial region 11 in the first direction D1 and a position of the third partial region 13 in the first direction D1. A position of the fifth partial region 15 in the first direction D1 is between the position of the third partial region 13 in the first direction D1 and a position of the second partial region 12 in the first direction D1.

The second semiconductor region 20 includes $Al_{x2}Ga_{1-x2}N$ ($0<x2<1$, $x1<x2$). The composition ratio x2 may be, for example, not less than 0.13 and not more than 0.25. The second semiconductor region 20 is, for example, an AlGaN layer. The second semiconductor region 20 includes a first semiconductor portion 21 and a second semiconductor portion 22. A direction from the fourth partial region 14 to the first semiconductor portion 21 is along the second direction D2. A direction from the fifth partial region 15 to the second semiconductor portion 22 is along the second direction D2.

The first nitride region 30 includes $Al_{z1}Ga_{1-z1}N$ ($0<z1\leq 1$, $x2<z1$). The composition ratio z1 may be, for example, not less than 0.8 and not more than 1. The first nitride region 30 may be, for example, an AlN layer. The first nitride region 30 includes a first nitride portion 31. The first nitride portion 31 is located between the third partial region 13 and the first electrode portion 53*a*.

The first insulating member 41 includes a first insulating portion 41*a*. The first insulating portion 41*a* is located between the first nitride portion 31 and the first electrode portion 53*a*.

A current flowing between the first electrode 51 and the second electrode 52 is controlled by a potential of the third electrode 53. The potential of the third electrode 53 may be, for example, a potential based on a potential of the first electrode 51.

The first electrode 51 functions, for example, as a source electrode. The second electrode 52 functions, for example, as a drain electrode. The third electrode 53 functions, for example, as a gate electrode. The semiconductor device 110 is, for example, a transistor.

The first semiconductor region 10 includes a portion facing the second semiconductor region 20. A carrier region is formed in this portion. The carrier region is, for example, a two-dimensional electron gas. The semiconductor device 110 is, for example, a HEMT (High Electron Mobility Transistor).

In the embodiment, the concentration of chlorine is appropriately controlled in the region including the first nitride portion 31. Thereby, a stable operation can be obtained.

Figure 2A:
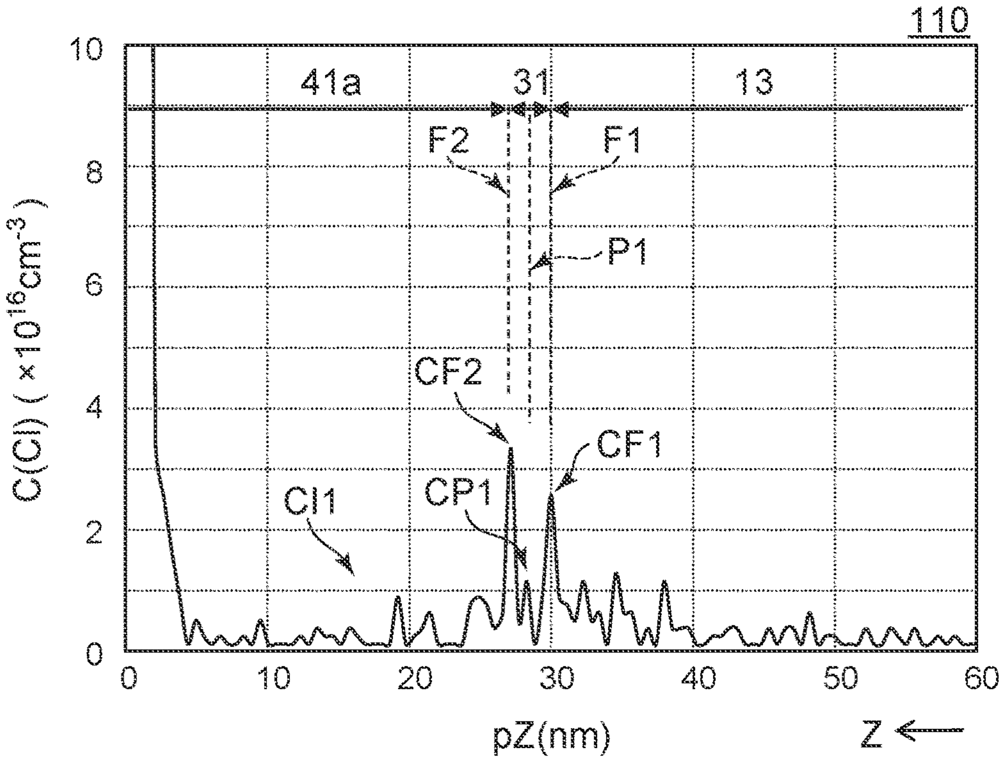
FIGS. 2A and 2B are graphs illustrating characteristics of the semiconductor device.
Figure 2B:
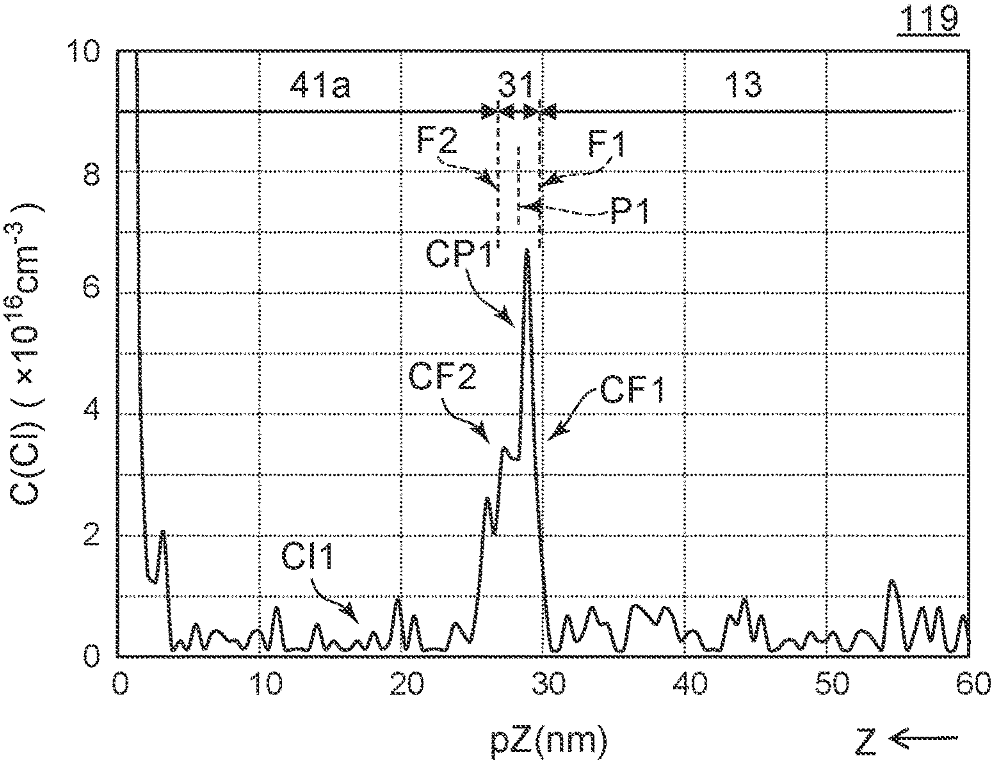

FIGS. 2A and 2B are graphs illustrating characteristics of the semiconductor device.

These figures illustrate SIMS analysis results of semiconductor devices. FIG. 2A corresponds to the semiconductor device 110 according to the embodiment. FIG. 2B corresponds to a semiconductor device 119 of a reference example. The horizontal axis of these figures is the position pZ in the Z-axis direction. The vertical axis of these figures is chlorine concentration C(Cl).

As shown in FIG. 2A, the first nitride portion 31 includes a first position P1 (see FIG. 1). The first position P1 is the center of the first nitride portion 31 in the second direction D2 (Z-axis direction). As shown in FIG. 2A, the third partial region 13 includes a first face F1 (see FIG. 1). The first face F1 faces the first nitride portion 31.

As shown in FIG. 2A, the chlorine concentration CP1 at the first position P1 is lower than the chlorine concentration CF1 at the first face F1.

The chlorine concentration CF1 at the first face F1 is, for example, not less than $5.16\times10^{15}$ $cm^{-3}$ and not more than $2.58\times10^{16}$ $cm^{-3}$ in GaN quantification. The chlorine concentration CF1 on at first face F1 may be, for example, not less than $6.44\times10^{16}$ $cm^{-3}$ and not more than $1.43\times10^{17}$ $cm^{-3}$ in $SiO_2$ quantification.

The chlorine concentration CP1 at the first position P1 is, for example, not less than $2.00\times10^{15}$ $cm^{-3}$ and not more than $5.16\times10^{16}$ $cm^{-3}$ in GaN quantification. The chlorine concentration CP1 at the first position P1 may be, for example, not less than $2.00\times10^{16}$ $cm^{-3}$ and not more than $6.44\times10^{16}$ $cm^{-3}$ in $SiO_2$ quantification.

As shown in FIG. 2A, the first nitride portion 31 includes a second face F2 (see FIG. 1). The second face F2 faces the first insulating portion 41*a*. The chlorine concentration CP1 at the first position P1 is lower than the chlorine concentration CF2 at the second face F2.

The chlorine concentration CF2 on the second face F2 is, for example, not less than $5.16\times10^{15}$ $cm^{-3}$ and not more than $3.35\times10^{16}$ $cm^{-3}$ in GaN quantification. The chlorine concentration CF2 at the second face F2 may be, for example, not less than $6.44\times10^{15}$ $cm^{-3}$ and not more than $1.86\times10^{17}$ $cm^{-3}$ in $SiO_2$ quantification.

As shown in FIG. 2A, the chlorine concentration CI1 in the first insulating portion 41*a* is lower than the chlorine concentration CF2 in the second face F2.

The first face F1 corresponds to an interface between the third partial region 13 and the first nitride portion 31. The second face F2 corresponds to an interface between the first nitride portion 31 and the first insulating portion 41*a*. The concentration of chlorine at the first position P1 is lower than the concentrations of chlorine at these interfaces. Furthermore, the concentrations of chlorine at these interfaces are not excessively high. In the embodiments, the region including the first face F1 and the second face F2 includes chlorine at a suitable concentration. As a result, for example, on the first face F1 of the third partial region 13 (for example, GaN), it is considered that dangling bonds of Ga are appropriately terminated with chlorine. For example, on the second face F2 of the first nitride portion 31 (for example, AlN), it is considered that the dangling bonds of the elements includes in the first nitride portion 31 are properly terminated with chlorine. Thereby, stable characteristics can be obtained. Examples of characteristics are described below.

Such a semiconductor device 110 can be obtained, for example, by removing a part of the second semiconductor region 20 formed on the first semiconductor region 10 with a gas including chlorine and then performing treatment with an inert gas such as Ar.

FIG. 2B corresponds to the semiconductor device 119 of the reference example. In the semiconductor device 119, after a part of the second semiconductor region 20 is removed by a gas including chlorine, the above processing by an inert gas such as Ar is not performed.

As shown in FIG. 2B, in the semiconductor device 119, the chlorine concentration CP1 at the first position P1 is higher than the chlorine concentration CF1 at the first face F1. The chlorine concentration CP1 at the first position P1 is higher than the chlorine concentration CF2 at the second face F2. The first nitride portion 31 includes chlorine at a high concentration. The characteristics of such a semiconductor device 119 are easy to change.

In the SIMS analysis results illustrated in FIGS. 2A and 2B, the increase of the chlorine concentration C(Cl) on the surface side of the first insulating portion 41*a* (the region where the position pZ is not less than 0 nm and not more than 5 nm) is due to the analytical method or samples. A high chlorine concentration C(Cl) on the surface side of the first insulating portion 41*a* (the region where the position pZ is not less than 0 nm and not more than 5 nm) can be ignored.

In the embodiment, for example, the maximum value of the chlorine concentration C(Cl) in the portion including the first insulating portion 41*a*, the first nitride portion 31 and the third partial region 13 may be, for example, not less than $2\times10^{15}$ $cm^{-3}$ and not more than $3.4\times10^{16}$ $cm^{-3}$ in GaN quantification. For example, the maximum value of the chlorine concentration C(Cl) in the portion including the first insulating portion 41*a*, the first nitride portion 31 and the third partial region 13 may be, for example, $2.00\times10^{16}$ $cm^{-3}$ and not more than $5.01\times10^{16}$ $cm^{-3}$ in $SiO_2$ quantification. The chlorine concentration is controlled within an appropriate range. Stable characteristics can be obtained.

Examples of characteristics of the semiconductor devices 110 and 119 will be described below.

Figure 3A:
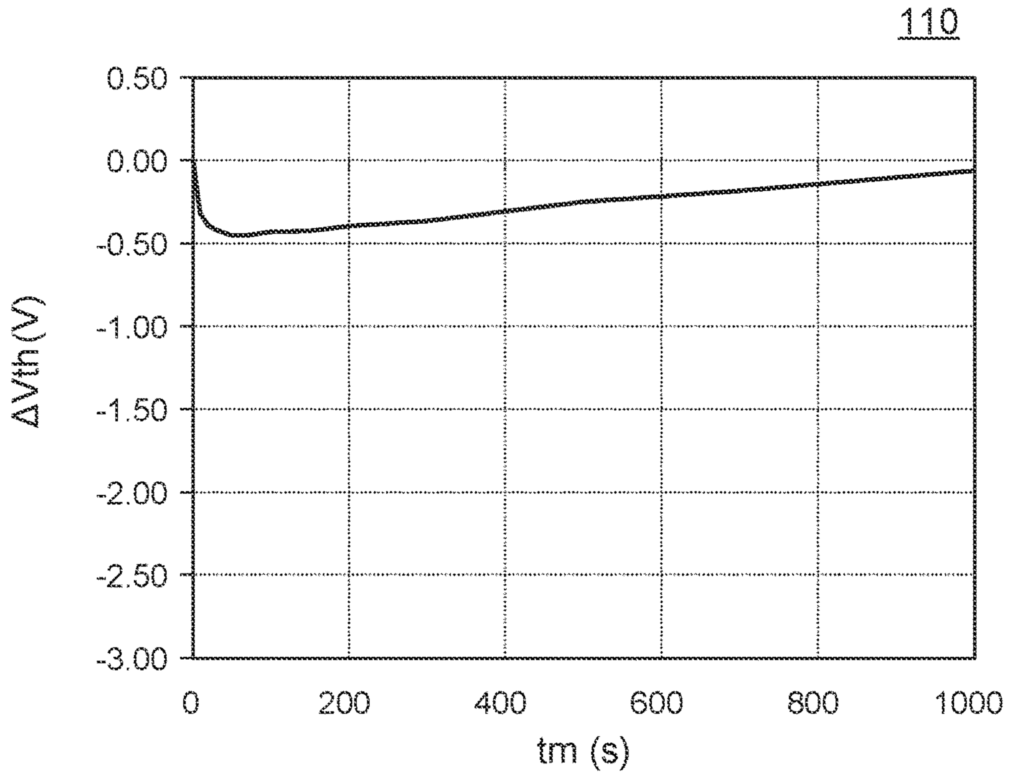
FIGS. 3A and 3B are graphs illustrating the characteristics of the semiconductor devices.
Figure 3B:
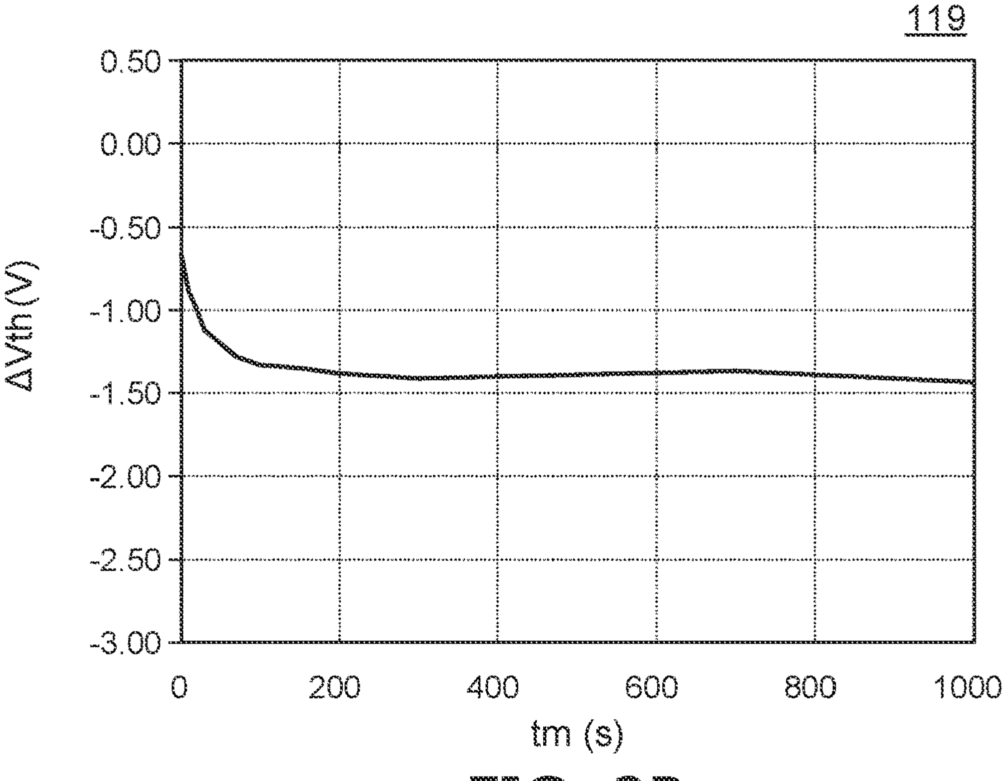

FIGS. 3A and 3B are graphs illustrating the characteristics of the semiconductor devices.

The horizontal axis of these figures is the elapsed time tm in a bias application test. In the bias application test, a voltage of +1V is applied between the source and the drain and a voltage of +15V is applied between the source and the gate. The vertical axis of these figures is the threshold voltage change ΔVth. The threshold voltage change ΔVth is a change in the threshold voltage with reference to the initial threshold voltage (the time tm is 0 s).

As shown in FIG. 3A, in the semiconductor device 110, the threshold voltage change ΔVth becomes 0 as time tm elapses. As shown in FIG. 3B, in the semiconductor device 119, the threshold voltage change ΔVth changes to the negative side and shifts significantly from 0 as time tm elapses. Thus, in semiconductor device 110, a stable threshold voltage can be obtained.

Figure 4A:
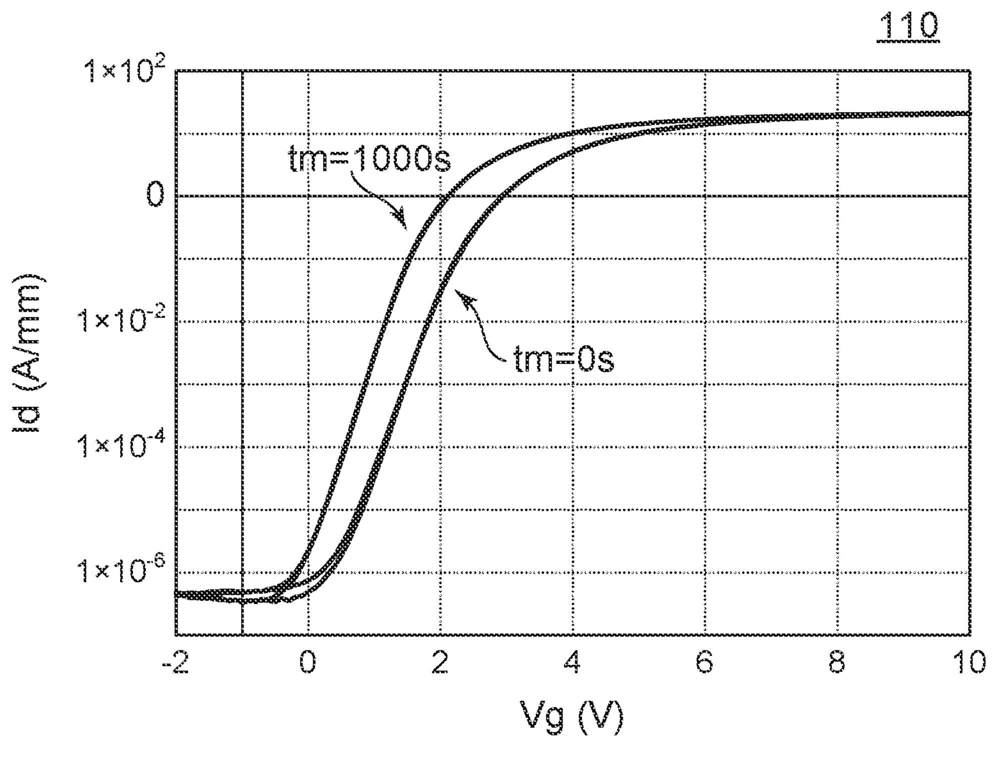
FIGS. 4A and 4B are graphs illustrating characteristics of the semiconductor devices.
Figure 4B:
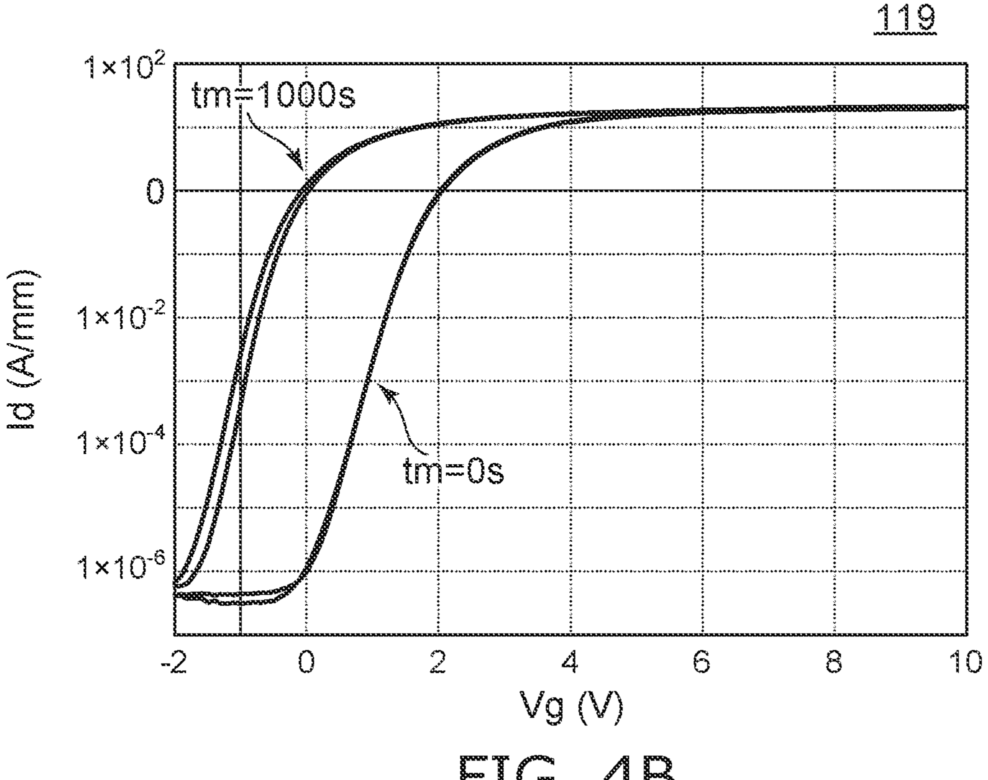

FIGS. 4A and 4B are graphs illustrating characteristics of the semiconductor devices.

The horizontal axis of these figures is the gate voltage Vg. The vertical axis of these figures is the drain current Id. These figures exemplify the characteristics before the bias application test (tm=0 s) and the characteristics when the elapsed time tm in the bias application test is 1000 s.

As shown in FIG. 4A, in the semiconductor device 110, the difference between the drain current Id when the time tm is 0 s and the drain current Id when the time tm is 1000 s is small. As shown in FIG. 4B, in the semiconductor device 119, the difference between the drain current Id when the time tm is 0 s and the drain current Id when the time tm is 1000 s is large. Thus, in the semiconductor device 110, a stable drain current Id can be obtained.

Thus, according to the semiconductor device 110 according to the embodiment, it is possible to provide a semiconductor device with stable characteristics.

Figure 5:
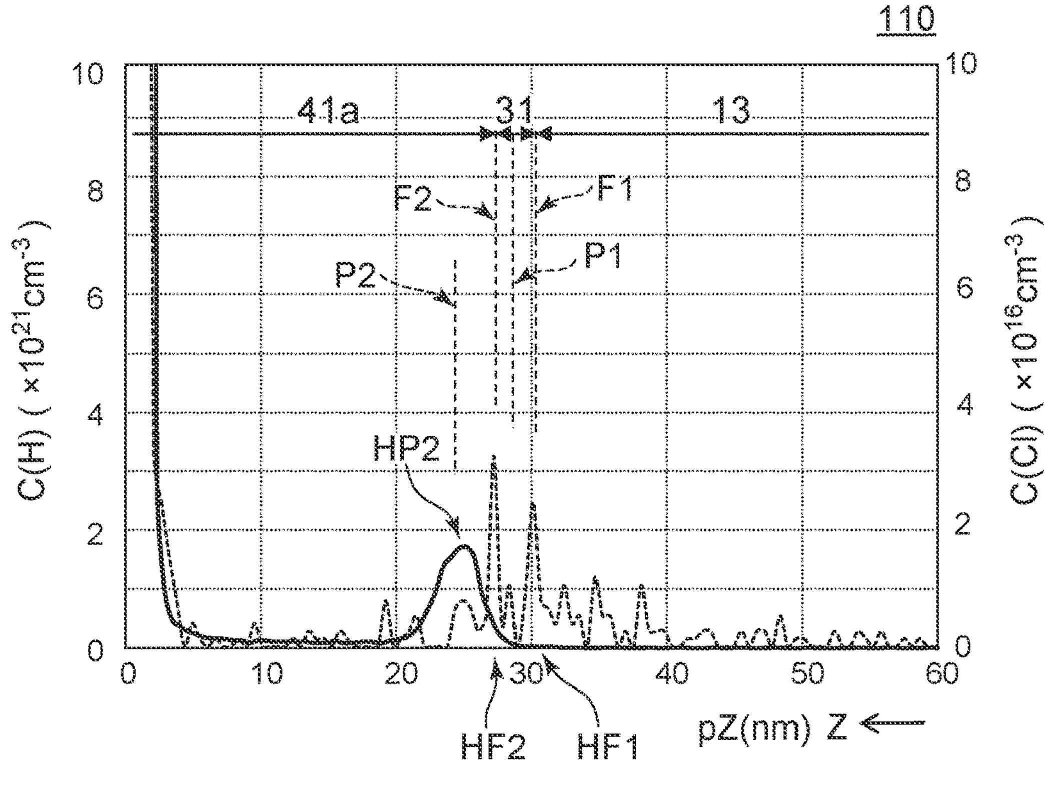
FIG. 5 is a graph illustrating characteristics of the semiconductor device according to the first embodiment.

FIG. 5 is a graph illustrating characteristics of the semiconductor device according to the first embodiment.

FIG. 5 illustrates SIMS analysis results of the semiconductor device 110. In FIG. 5, the hydrogen concentration C(H) is shown by a solid line. In FIG. 5, the chlorine concentration C(Cl) illustrated in FIG. 2A is shown by a dashed line. The hydrogen concentration C(H) corresponds to the left vertical axis. The chlorine concentration C(Cl) corresponds to the right vertical axis. The horizontal axis is the position pZ in the Z-axis direction.

As shown in FIG. 5, the first insulating portion 41*a* includes a second position P2 (see FIG. 1). The direction from the first position P1 to the second position P2 is along the second direction D2 (Z-axis direction).

As shown in FIG. 5, the hydrogen concentration HP2 at the second position P2 is higher than the hydrogen concentration HF1 at the first face F1. The hydrogen concentration HF2 at the second face F2 is between the hydrogen concentration HP2 at the second position P2 and the hydrogen concentration HF1 at the first face F1.

For example, the concentration of hydrogen in the portion including the first insulating portion 41*a*, the first nitride portion 31 and the third partial region 13 becomes a peak at the second position P2. The hydrogen concentration HP2 at the second position P2 is, for example, not less than $6.0\times10^{18}$ $cm^{-3}$ and not more than $1.70\times10^{21}$ $cm^{-3}$. The hydrogen concentration HF1 at the first face F1 is, for example, not less than $4.0\times10^{17}$ $cm^{-3}$ and not more than $8.7\times10^{18}$ $cm^{-3}$.

Thus, the second position P2 where the hydrogen concentration becomes peak is located in the first insulating portion 41*a*. For example, the concentration of hydrogen is low at the first face F1 and the second face F2. The influence of hydrogen at the interfaces is suppressed. Thereby, more stable operation can be obtained.

In the SIMS analysis results illustrated in FIG. 5, the increase of the hydrogen concentration C(H) on the surface side of the first insulating portion 41*a* (the region where the position pZ is not less than 0 nm and not more than 5 nm) is due to the analysis method or the samples. The high hydrogen concentration C(H) on the surface side of the first insulating portion 41*a* (the region where the position pZ is not less than 0 nm and not more than 5 nm) can be ignored.

As shown in FIG. 1, in the semiconductor device 110, for example, the first nitride portion 31 is located between the fourth partial region 14 and the fifth partial region 15 in the first direction D1. The first insulating portion 41*a* is located between the fourth partial region 14 and the fifth partial region 15 in the first direction D1. At least a part of the first electrode portion 53*a* is located between the first semiconductor portion 21 and the second semiconductor portion 22 in the first direction D1. The third electrode 53 is, for example, a recessed gate electrode. By such a configuration, a high threshold voltage can be obtained. For example, normally-off operation is obtained.

In the embodiment, the thickness along the second direction D2 of the first nitride portion 31 is, for example, not less than 1 nm and not more than 10 nm. For example, high mobility can be obtained.

The thickness along the second direction D2 of the first insulating portion 41*a* is, for example, not less than 20 nm and not more than 40 nm. For example, an appropriate threshold voltage can be obtained.

As shown in FIG. 1, the first nitride region 30 may further include a second nitride portion 32 and a third nitride portion 33. The second nitride portion 32 is located between the first semiconductor portion 21 and the first electrode portion 53*a* in the first direction D1. The third nitride portion 33 is located between the first electrode portion 53*a* and the second semiconductor portion 22 in the first direction D1.

As shown in FIG. 1, the semiconductor device 110 may further include a second insulating member 42. The second insulating member 42 includes a first insulating region 42*a* and a second insulating region 42*b*. The first nitride region 30 may further include a fourth nitride portion 34 and a fifth nitride portion 35. The first insulating region 42*a* is located between the first semiconductor portion 21 and the fourth nitride portion 34. The second insulating region 42*b* is located between the second semiconductor portion 22 and the fifth nitride portion 35.

The second insulating member 42 functions, for example, as a protective film. The second insulating member 42 may include silicon and nitrogen. The first insulating member 41 includes silicon and oxygen. For example, the concentration of nitrogen in the second insulating member 42 is higher than the concentration of nitrogen included in the first insulating member 41. For example, the oxygen concentration in the first insulating member 41 is higher than the oxygen concentration in the second insulating member 42.

The first nitride portion 31, the second nitride portion 32 and the third nitride portion 33 include crystals (including microcrystals). The fourth nitride portion 34 and the fifth nitride portion 35 may include amorphous region.

As shown in FIG. 1, the semiconductor device 110 may include a substrate 18$s$ and a nitride layer 18. The nitride layer 18 is located between the substrate 18$s$ and the first semiconductor region 10. The substrate 18$s$ may include, for example, a silicon substrate. The nitride layer 18 includes nitrogen and at least one selected from the group consisting of Al and Ga. The nitride layer 18 is, for example, a buffer layer.

Figure 6:
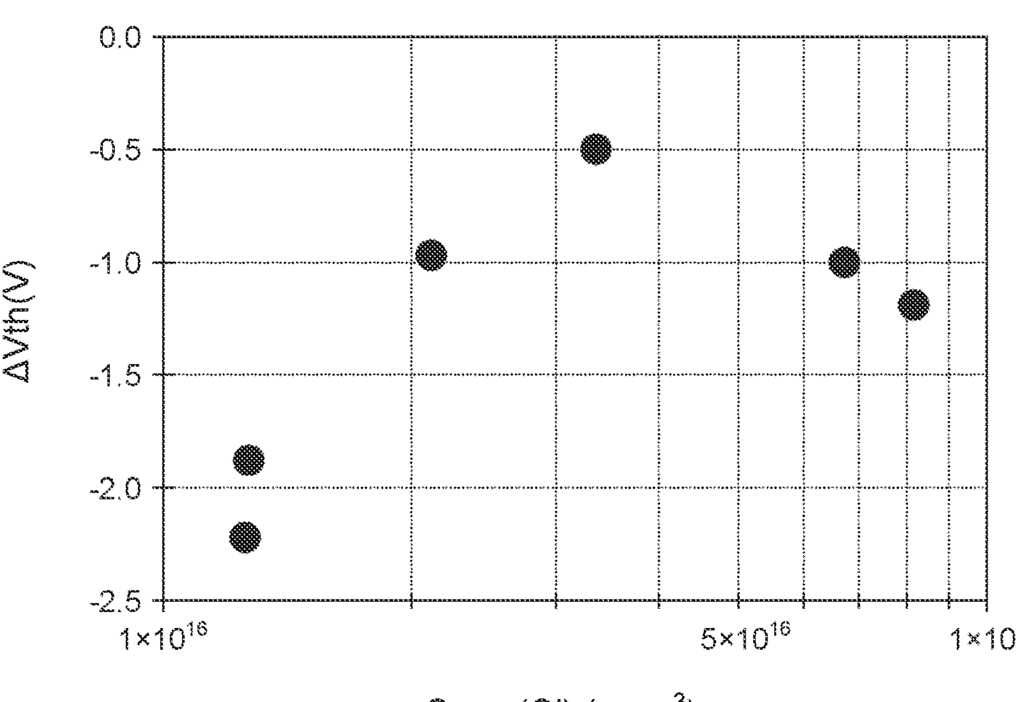
FIG. 6 is a graph illustrating characteristics of the semiconductor device according to the first embodiment.

FIG. 6 is a graph illustrating characteristics of the semiconductor device according to the first embodiment.

The horizontal axis of FIG. 6 is the peak chlorine concentration Cmax(Cl) in the region including the first face F1, the second face F2, and the first nitride portion 31. In one example, the peak concentration Cmax(Cl) may correspond to any one of the chlorine concentration CF1 at the first face F1, the chlorine concentration CP1 at the position P1, and the chlorine concentration CF2 at the second face F2. The vertical axis of FIG. 6 is the threshold voltage change ΔVth.

As shown in FIG. 6, in the region where the peak chlorine concentration Cmax(Cl) is about $3.2\times10^{16}$ $cm^{-3}$ or less, when the peak chlorine concentration Cmax(Cl) increases, the absolute value of the threshold voltage change ΔVth becomes smaller. In the region where the peak chlorine concentration Cmax(Cl) exceeds about $3.2\times10^{16}$ $cm^{-3}$, the absolute value of the threshold voltage change ΔVth increases as the peak chlorine concentration Cmax(Cl) increases. The absolute value of the threshold voltage change ΔVth can be reduced by controlling the peak chlorine concentration Cmax(Cl) within an appropriate range.

It is preferable that the peak chlorine concentration Cmax (Cl) satisfies at least one of a first condition or a second condition. In the first condition, the peak chlorine concentration Cmax(Cl) is not less than $2.1\times10^{16}$ $cm^{-3}$ and not more than $6.72\times10^{16}$ $cm^{-3}$ in GaN quantification. In the second condition, the peak chlorine concentration Cmax(Cl) is not less than $1.6\times10^{17}$ $cm^{-3}$ and not more than $3.87\times10^{17}$ $cm^{-3}$ in $SiO_2$ quantification. In such conditions, for example, a small absolute value of the threshold voltage change ΔVth is obtained. For example, the absolute value of threshold voltage change ΔVth is, for example, 1.0 V or less.

Second Embodiment

The second embodiment relates to a method for manufacturing a semiconductor device.

Figure 7:
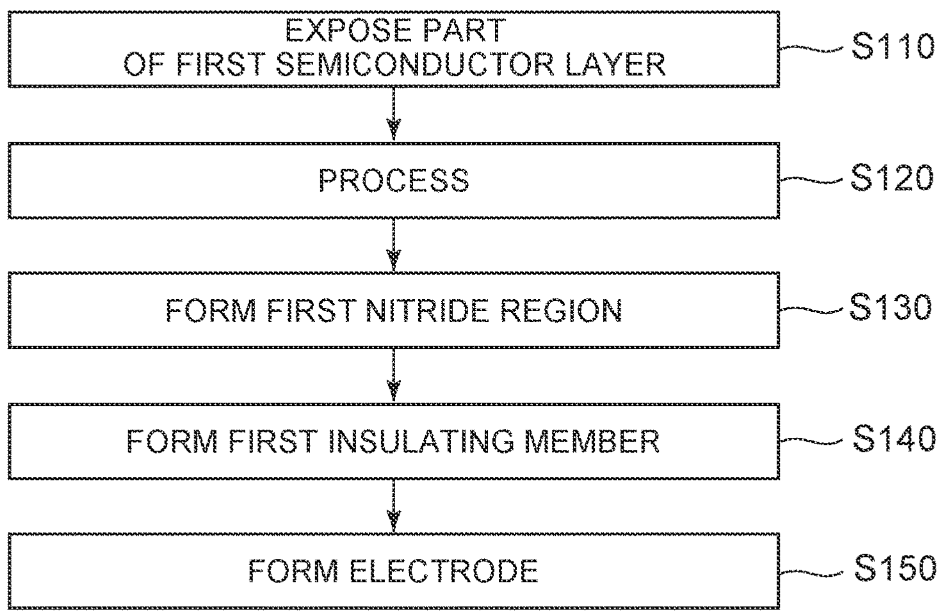
FIG. 7 is a flowchart illustrating a method for manufacturing a semiconductor device according to a second embodiment.

FIG. 7 is a flowchart illustrating a method for manufacturing a semiconductor device according to the second embodiment.

Figure 8:
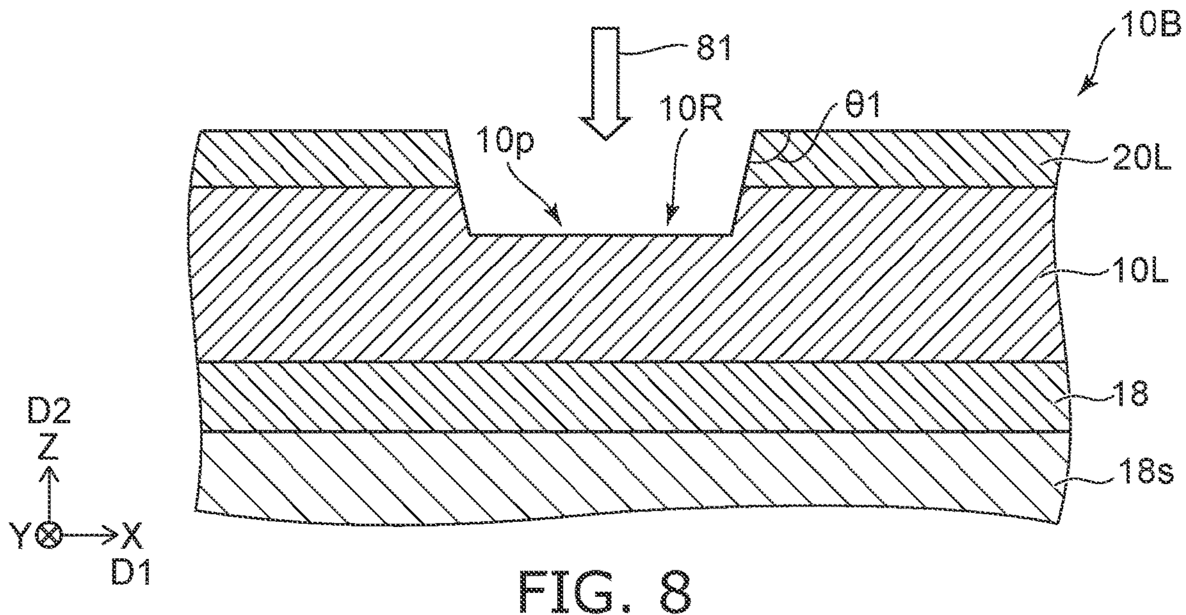
FIG. 8 is a schematic cross-sectional view illustrating a part of the method for manufacturing the semiconductor device according to the second embodiment.

FIG. 8 is a schematic cross-sectional view illustrating a part of the method for manufacturing the semiconductor device according to the second embodiment.

As shown in FIG. 8, the structure 10B is prepared. The structure 10B includes a first semiconductor layer 10L including $Al_{x1}Ga_{1-x1}N$ ($0\leq x1<1$) and a second semiconductor layer 20L including $Al_{x2}Ga_{1-x2}N$ ($0<x2<1$, $x1<x2$).

As shown in FIG. 8, a part of the second semiconductor layer 20L of the structural body 10B is removed to form a recess 10R, and a portion 10$p$ of the first semiconductor layer 10L is exposed at the bottom of the recess 10R (step S110 in FIG. 7).

As shown in FIG. 8, the portion 10$p$ being exposed of the first semiconductor layer 10L is processed with gas. The gas includes at least one element 81 selected from the group consisting of Ar, He, Ne and Kr. For example, processing is performed with a gas including Ar (step S120 in FIG. 7). This processing removes excess chlorine included in the portion 10$p$ of the first semiconductor layer 10L. At this time, an appropriate concentration of chlorine remains on the surface of the portion 10$p$ of the first semiconductor layer 10L. As a result, termination is appropriately performed on the surface of the portion 10$p$ of the first semiconductor layer 10L.

As shown in FIG. 7, the first nitride region 30 including $Al_{z1}Ga_{1-z1}N$ ($0<z1\leq1$, $x2<z1$) is formed on the portion 10$p$ being processed of first semiconductor layer 10L of the structure 10B (step S130). The second insulating member 42 may be formed prior to the formation of the first nitride region 30, if necessary.

The first insulating member 41 is formed on the first nitride region 30 (step S140).

In the remaining space of the recess 10R, a conductive member is embedded on the first insulating member 41 to form the third electrode 53; and the first electrode 51 electrically connected to a part of the second semiconductor layer 20L, and the second electrode 52 electrically connected to another part of the second semiconductor layer 20L are formed (step S150). At least a part of the third electrode 53 is located between the first electrode 51 and the second electrode 52.

In step S110 described above, the formation of the recess 10R includes, for example, a processing using chlorine. The processing with chlorine includes, for example, treatment with a gas including at least one selected from the group consisting of $BCl_3$ and $SiCl_4$.

The treatment with gas in step S120 includes, for example, removing a part of the chlorine remaining in the portion 10$p$ being exposed of the first semiconductor layer 10L. The treatment with gas in step S120 may include, for example, removing a surface part of the portion 10$p$ being exposed of the first semiconductor layer 10L.

In forming the recess 10R, the sidewall of the recess 10R may be tapered. For example, the angle θ1 (see FIG. 8) between the surface of the second semiconductor layer 20L and the sidewall of the recess 10R is greater than 90 degrees, for example. The angle θ1 may be, for example, not less than 110 degrees and not more than 130 degrees.

Embodiments may include the following configurations (for example, technical proposals).

Configuration 1

A semiconductor device, comprising:

a first electrode;

a second electrode, a direction from the first electrode to the second electrode being along a first direction;

a third electrode including a first electrode portion, a position of the third electrode in the first direction being between a position of the first electrode in the first direction and a position of the second electrode in the first direction;

a first semiconductor region including $Al_{x1}Ga_{1-x1}N$ ($0\leq x1<1$), the first semiconductor region including a first partial region, a second partial region, a third partial region, a fourth partial region, and a fifth partial region, a second direction from the first partial region to the first electrode crossing the first direction, a direction from the second partial region to the second electrode being along the second direction, a direction from the third partial region to the first electrode being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction;

a second semiconductor region including $Al_{x2}Ga_{1-x2}N$ ($0<x2<1$, $x1<x2$), the second semiconductor region including a first semiconductor portion and a second semiconductor portion, a direction from the fourth partial region to the first semiconductor portion being along the second direction, a direction from the fifth partial region to the second semiconductor portion being along the second direction;

a first nitride region including $Al_{z1}Ga_{1-z1}N$ ($0<z1\leq1$, $x2<z1$), the first nitride region including a first nitride portion, the first nitride portion being located between the third partial region and the first electrode portion; and a first insulating member including a first insulating portion, the first insulating portion being located between the first nitride portion and the first electrode portion, the first nitride portion including a first position, the first position being a center of the first nitride portion in the second direction, the third partial region including a first face facing the first nitride portion, and a chlorine concentration at the first position being lower than a chlorine concentration at the first face.

Configuration 2

The semiconductor device according to Configuration 1, wherein the first nitride portion includes a second face facing the first insulating portion, the chlorine concentration in the first position is lower than a chlorine concentration at the second face.

Configuration 3

The semiconductor device according to Configuration 2, wherein a chlorine concentration in the first insulating portion is lower than the chlorine concentration in the second face.

Configuration 4

The semiconductor device according to Configuration 2 or 3, wherein a peak concentration of chlorine in a region including the first face, the second face and the first nitride portion satisfies at least one of a first condition or a second condition, in the first condition, the peak concentration is not less than $2.1\times10^{16}$ $cm^{-3}$ and not more than $6.72\times10^{16}$ $cm^{-3}$ in GaN quantification, and in the second condition, the peak concentration is not less than $1.6\times10^{17}$ $cm^{-3}$ to $3.87\times10^{17}$ $cm^{-3}$ in $SiO_2$ quantification.

Configuration 5

A semiconductor device, comprising:

a first electrode;

a second electrode, a direction from the first electrode to the second electrode being along a first direction;

a third electrode including a first electrode portion, a position of the third electrode in the first direction being between a position of the first electrode in the first direction and a position of the second electrode in the first direction;

a first semiconductor region including $Al_{x1}Ga_{1-x1}N$ ($0\leq x1<1$), the first semiconductor region including a first partial region, a second partial region, a third partial region, a fourth partial region, and a fifth partial region, a second direction from the first partial region to the first electrode crossing the first direction, a direction from the second partial region to the second electrode being along the second direction, a direction from the third partial region to the first electrode being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction;

a second semiconductor region including $Al_{x2}Ga_{1-x2}N$ ($0<x2<1$, $x1<x2$), the second semiconductor region including a first semiconductor portion and a second semiconductor portion, a direction from the fourth partial region to the first semiconductor portion being along the second direction, a direction from the fifth partial region to the second semiconductor portion being along the second direction;

a first nitride region including $Al_{z1}Ga_{1-z1}N$ ($0<z1\leq1$, $x2<z1$), the first nitride region including a first nitride portion, the first nitride portion being located between the third partial region and the first electrode portion; and a first insulating member including a first insulating portion, the first insulating portion being located between the first nitride portion and the first electrode portion, the third partial region including a first face facing the first nitride portion, the first nitride portion including a second face facing the first insulating portion, a peak concentration of chlorine in a region including the first face, the second face and the first nitride portion satisfies at least one of a first condition or a second condition, in the first condition, the peak concentration is not less than $2.1\times10^{16}$ $cm^{-3}$ and not more than $6.72\times10^{16}$ $cm^{-3}$ in GaN quantification, and in the second condition, the peak concentration is not less than $1.6\times10^{17}$ $cm^{-3}$ to $3.87\times10^{17}$ $cm^{-3}$ in $SiO_2$ quantification.

Configuration 6

The semiconductor device according to any one of Configurations 3-5, wherein the first insulating portion includes a second position, and a hydrogen concentration at the second position is higher than a hydrogen concentration at the first face.

Configuration 7

The semiconductor device according to Configuration 6, wherein a hydrogen concentration at the second face is between the hydrogen concentration at the second position and a hydrogen concentration at the first face.

Configuration 8

The semiconductor device according to Configuration 6 or 7, wherein a concentration of hydrogen in a portion including the first insulating portion, the first nitride portion and the third partial region becomes peak at the second position, and the hydrogen concentration at the second position is not less than $6.0\times10^{18}$ $cm^{-3}$ and not more than $1.70\times10^{21}$ $cm^{-3}$.

Configuration 9

The semiconductor device according to any one of Configurations 6-8, wherein the hydrogen concentration at the first face is not less than $4.0\times10^{17}$ $cm^{-3}$ and not more than $8.7\times10^{18}$ $cm^{-3}$.

Configuration 10

The semiconductor device according to any one of Configurations 1-9, wherein the first nitride portion is located between the fourth partial region and the fifth partial region in the first direction.

Configuration 11

The semiconductor device according to any one of Configurations 1-10, wherein the first insulating portion is located between the fourth partial region and the fifth partial region in the first direction.

Configuration 12

The semiconductor device according to any one of Configurations 1-11, wherein at least a part of the first electrode portion is located between the first semiconductor portion and the second semiconductor portion in the first direction.

Configuration 13

The semiconductor device according to any one of Configurations 1-12, wherein the x1 is not less than 0 and not more than 0.1, the x2 is not less than 0.13 and not more than 0.25, and the z1 is not less than 0.8 and not more than 1.

Configuration 14

The semiconductor device according to any one of Configurations 1-13, wherein a thickness of the first nitride portion along the second direction is not less than 1 nm and not more than 10 nm.

Configuration 15

The semiconductor device according to any one of Configurations 1-14, wherein a thickness of the first insulating portion along the second direction is not less than 20 nm and not more than 40 nm.

Configuration 16

The semiconductor device according to any one of Configurations 1-15, wherein the first nitride region further includes a second nitride portion and a third nitride portion, the second nitride portion is located between the first semiconductor portion and the first electrode portion in the first direction, and the third nitride portion is located between the first electrode portion and the second semiconductor portion in the first direction.

Configuration 17

The semiconductor device according to any one of Configurations 1-16, further comprising:

a second insulating member, the second insulating member including a first insulating region and a second insulating region, the first nitride region further includes a fourth nitride portion and a fifth nitride portion, the first insulating region is located between the first semiconductor portion and the fourth nitride portion, and the second insulating region is located between the second semiconductor portion and the fifth nitride portion.

Configuration 18

A method for manufacturing a semiconductor device, the method comprising:

forming a recess by removing a part of a second semiconductor layer of a structure to expose a portion of a first semiconductor layer at a bottom of the recess, the structure including the first semiconductor region including $Al_{x1}Ga_{1-x1}N$ ($0\leq x1<1$) and the second semiconductor region including $Al_{x2}Ga_{1-x2}N$ ($0<x2<1$, $x1<x2$);

processing the portion being exposed of the first semiconductor layer with a gas including at least one element selected from the group consisting of Ar, He, Ne and Kr;

forming a first nitride region including $Al_{z1}Ga_{1-z1}N$ ($0<z1\leq1$, $x2<z1$) on the portion being processed of the first semiconductor layer of the structure;

forming a third electrode by embedding a conductive member on the first insulating member in a remaining space of the recess, and forming a first electrode electrically connected to a part of the second semiconductor layer and forming a second electrode electrically connected to another portion of the semiconductor layer, at least a part of the third electrode being located between the first electrode and the second electrode.

Configuration 19

The method according to Configuration 18, wherein the forming the recess including a processing using chlorine.

Configuration 20

The method according to Configuration 19, wherein the processing with the gas includes removing a part of chlorine remaining on the portion being exposed of the first semiconductor layer.

According to the embodiments, it is possible to provide a semiconductor device with stable characteristics and a method of manufacturing the same.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as electrodes, semiconductor regions, nitride regions, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices and methods of manufacturing the same practicable by an appropriate design modification by one skilled in the art based on the semiconductor devices and methods of manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:

a first electrode;

a second electrode, a direction from the first electrode to the second electrode being along a first direction;

a third electrode including a first electrode portion, a position of the third electrode in the first direction being between a position of the first electrode in the first direction and a position of the second electrode in the first direction;

a first semiconductor region including $Al_{x1}Ga_{1-x1}N$ ($0 \leq x1 < 1$), the first semiconductor region including a first partial region, a second partial region, a third partial region, a fourth partial region, and a fifth partial region, a second direction from the first partial region to the first electrode crossing the first direction, a direction from the second partial region to the second electrode being along the second direction, a direction from the third partial region to the first electrode being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction;

a second semiconductor region including $Al_{x2}Ga_{1-x2}N$ ($0 < x2 < 1$, $x1 < x2$), the second semiconductor region including a first semiconductor portion and a second semiconductor portion, a direction from the fourth partial region to the first semiconductor portion being along the second direction, a direction from the fifth partial region to the second semiconductor portion being along the second direction;

a first nitride region including $Al_{z1}Ga_{1-z1}N$ ($0 < z1 \leq 1$, $x2 < z1$), the first nitride region including a first nitride portion, the first nitride portion being located between the third partial region and the first electrode portion; and a first insulating member including a first insulating portion, the first insulating portion being located between the first nitride portion and the first electrode portion, the first nitride portion including a first position, the first position being a center of the first nitride portion in the second direction, the third partial region including a first face facing the first nitride portion, and a chlorine concentration at the first position being lower than a chlorine concentration at the first face.

2. The semiconductor device according to claim 1, wherein the first nitride portion includes a second face facing the first insulating portion, the chlorine concentration in the first position is lower than a chlorine concentration at the second face.

3. The semiconductor device according to claim 2, wherein a chlorine concentration in the first insulating portion is lower than the chlorine concentration in the second face.

4. The semiconductor device according to claim 2, wherein a peak concentration of chlorine in a region including the first face, the second face and the first nitride portion satisfies at least one of a first condition or a second condition, in the first condition, the peak concentration is not less than $2.1 \times 10^{16}$ $cm^{-3}$ and not more than $6.72 \times 10^{16}$ $cm^{-3}$ in GaN quantification, and in the second condition, the peak concentration is not less than $1.6 \times 10^{17}$ $cm^{-3}$ to $3.87 \times 10^{17}$ $cm^{-3}$ in $SiO_2$ quantification.

5. The semiconductor device according to claim 3, wherein the first insulating portion includes a second position, and a hydrogen concentration at the second position is higher than a hydrogen concentration at the first face.

6. The semiconductor device according to claim 5, wherein a hydrogen concentration at the second face is between the hydrogen concentration at the second position and a hydrogen concentration at the first face.

7. The semiconductor device according to claim 5, wherein a concentration of hydrogen in a portion including the first insulating portion, the first nitride portion and the third partial region becomes peak at the second position, and the hydrogen concentration at the second position is not less than $6.0 \times 10^{18}$ $cm^{-3}$ and not more than $1.70 \times 10^{21}$ $cm^{-3}$.

8. The semiconductor device according to claim 5, wherein the hydrogen concentration at the first face is not less than $4.0 \times 10^{17}$ $cm^{-3}$ and not more than $8.7 \times 10^{18}$ $cm^{-3}$.

9. The semiconductor device according to claim 1, wherein the first nitride portion is located between the fourth partial region and the fifth partial region in the first direction.

10. The semiconductor device according to claim 1, wherein the first insulating portion is located between the fourth partial region and the fifth partial region in the first direction.

11. The semiconductor device according to claim 1, wherein at least a part of the first electrode portion is located between the first semiconductor portion and the second semiconductor portion in the first direction.

12. The semiconductor device according to claim 1, wherein the x1 is not less than 0 and not more than 0.1, the x2 is not less than 0.13 and not more than 0.25, and the z1 is not less than 0.8 and not more than 1.

13. The semiconductor device according to claim 1, wherein a thickness of the first nitride portion along the second direction is not less than 1 nm and not more than 10 nm.

14. The semiconductor device according to claim 1, wherein a thickness of the first insulating portion along the second direction is not less than 20 nm and not more than 40 nm.

15. The semiconductor device according to claim 1, wherein the first nitride region further includes a second nitride portion and a third nitride portion, the second nitride portion is located between the first semiconductor portion and the first electrode portion in the first direction, and the third nitride portion is located between the first electrode portion and the second semiconductor portion in the first direction.

16. The semiconductor device according to claim 1, further comprising:

a second insulating member, the second insulating member including a first insulating region and a second insulating region, the first nitride region further includes a fourth nitride portion and a fifth nitride portion, the first insulating region is located between the first semiconductor portion and the fourth nitride portion, and the second insulating region is located between the second semiconductor portion and the fifth nitride portion.

17. A semiconductor device, comprising:

a first electrode;

a second electrode, a direction from the first electrode to the second electrode being along a first direction;

a third electrode including a first electrode portion, a position of the third electrode in the first direction being between a position of the first electrode in the first direction and a position of the second electrode in the first direction;

a first semiconductor region including $Al_{x1}Ga_{1-x1}N$ ($0 \leq x1 < 1$), the first semiconductor region including a first partial region, a second partial region, a third partial region, a fourth partial region, and a fifth partial region, a second direction from the first partial region to the first electrode crossing the first direction, a direction from the second partial region to the second electrode being along the second direction, a direction from the third partial region to the first electrode being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction;

a second semiconductor region including $Al_{x2}Ga_{1-x2}N$ ($0 < x2 < 1$, $x1 < x2$), the second semiconductor region including a first semiconductor portion and a second semiconductor portion, a direction from the fourth partial region to the first semiconductor portion being along the second direction, a direction from the fifth partial region to the second semiconductor portion being along the second direction;

a first nitride region including $Al_{z1}Ga_{1-z1}N$ ($0 < z1 \leq 1$, $x2 < z1$), the first nitride region including a first nitride portion, the first nitride portion being located between the third partial region and the first electrode portion; and a first insulating member including a first insulating portion, the first insulating portion being located between the first nitride portion and the first electrode portion, the third partial region including a first face facing the first nitride portion, the first nitride portion including a second face facing the first insulating portion, a peak concentration of chlorine in a region including the first face, the second face and the first nitride portion satisfies at least one of a first condition or a second condition, in the first condition, the peak concentration is not less than $2.1 \times 10^{16}$ cm$^{-3}$ and not more than $6.72 \times 10^{16}$ cm$^{-3}$ in GaN quantification, and in the second condition, the peak concentration is not less than $1.6 \times 10^{17}$ cm$^{-3}$ to $3.87 \times 10^{17}$ cm$^{-3}$ in $SiO_2$ quantification.

* * * * *